(12) United States Patent
Dayyala et al.

(10) Patent No.: US 12,123,708 B2
(45) Date of Patent: Oct. 22, 2024

(54) ENHANCED CROSS SECTIONAL FEATURES MEASUREMENT METHODOLOGY

(71) Applicant: Applied Materials, Inc., Santa Clara, CA (US)

(72) Inventors: Manoj Kumar Dayyala, Newark, CA (US); Jorge Pablo Fernandez, Saratoga, CA (US); Kourosh Nafisi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 214 days.

(21) Appl. No.: 17/607,846

(22) PCT Filed: May 21, 2020

(86) PCT No.: PCT/US2020/034101
§ 371 (c)(1),
(2) Date: Oct. 29, 2021

(87) PCT Pub. No.: WO2020/237105
PCT Pub. Date: Nov. 26, 2020

(65) Prior Publication Data
US 2022/0214165 A1    Jul. 7, 2022

Related U.S. Application Data

(60) Provisional application No. 62/850,646, filed on May 21, 2019.

(51) Int. Cl.
*G01B 15/04* (2006.01)
*G03F 7/00* (2006.01)
(Continued)

(52) U.S. Cl.
CPC ........ *G01B 15/04* (2013.01); *G03F 7/70625* (2013.01); *G06T 7/001* (2013.01);
(Continued)

(58) Field of Classification Search
CPC . G01B 15/04; G01B 2210/56; G03F 7/70625; G06T 7/001; G06T 2207/10061; G06T 2207/30148; H01L 22/12
(Continued)

(56) References Cited

U.S. PATENT DOCUMENTS 6,353,222 B1    3/2002   Dotan
6,472,662 B1   10/2002   Archie
(Continued)

FOREIGN PATENT DOCUMENTS

CN    1402322 A    3/2003
CN    1484098 A    3/2004
(Continued)

OTHER PUBLICATIONS

PCT International Search Report and Written Opinion for International Application No. PCT/US2020/034101, dated Sep. 4, 2020, 9 pages.

*Primary Examiner* — Nicole M Ippolito
(74) *Attorney, Agent, or Firm* — Lowenstein Sandler LLP

(57) ABSTRACT

Disclosed herein are methods and systems for analyzing a cross-sectional feature of a structural element on a semiconductor wafer to determine whether an isolated or a systemic failure to reach preselected parameters occurred.

20 Claims, 9 Drawing Sheets

(51) Int. Cl.
 *G06T 7/00* (2017.01)
 *H01L 21/66* (2006.01)

(52) U.S. Cl.
 CPC ............... *G01B 2210/56* (2013.01); *G06T 2207/10061* (2013.01); *G06T 2207/30148* (2013.01); *H01L 22/12* (2013.01)

(58) Field of Classification Search
 USPC .................. 250/306, 307, 309, 310, 311
 See application file for complete search history.

(56) References Cited

U.S. PATENT DOCUMENTS

| | | | |
|---|---|---|---|
| 6,670,612 | B1 | 12/2003 | Lorusso et al. |
| 2003/0012422 | A1 | 1/2003 | Sawai et al. |
| 2004/0164243 | A1 | 8/2004 | Kazui et al. |
| 2005/0100205 | A1 | 5/2005 | Shishido et al. |
| 2005/0133718 | A1 | 6/2005 | Miyamoto et al. |
| 2005/0285034 | A1 | 12/2005 | Tanaka et al. |
| 2006/0210143 | A1 | 9/2006 | Miyamoto et al. |
| 2007/0105243 | A1 | 5/2007 | Nagatomo et al. |
| 2007/0187595 | A1 | 8/2007 | Tanaka et al. |
| 2013/0146763 | A1* | 6/2013 | Kawada ............ H01J 37/222 382/217 |
| 2013/0166240 | A1 | 6/2013 | Shishido et al. |
| 2014/0319344 | A1* | 10/2014 | Miller ............... G06T 7/60 250/307 |
| 2016/0035538 | A1 | 2/2016 | Fukuda |
| 2019/0035597 | A1 | 1/2019 | Krasienapibal et al. |
| 2019/0252229 | A1 | 8/2019 | Ishii et al. |

FOREIGN PATENT DOCUMENTS

| | | |
|---|---|---|
| CN | 1668915 B | 6/2011 |
| CN | 101924053 B | 6/2014 |
| JP | 2017199540 A | 11/2017 |
| KR | 20150001772 A | 1/2015 |
| TW | 201428233 A | 7/2014 |
| TW | 201614681 A | 4/2016 |
| WO | 2018213758 A3 | 12/2018 |

\* cited by examiner

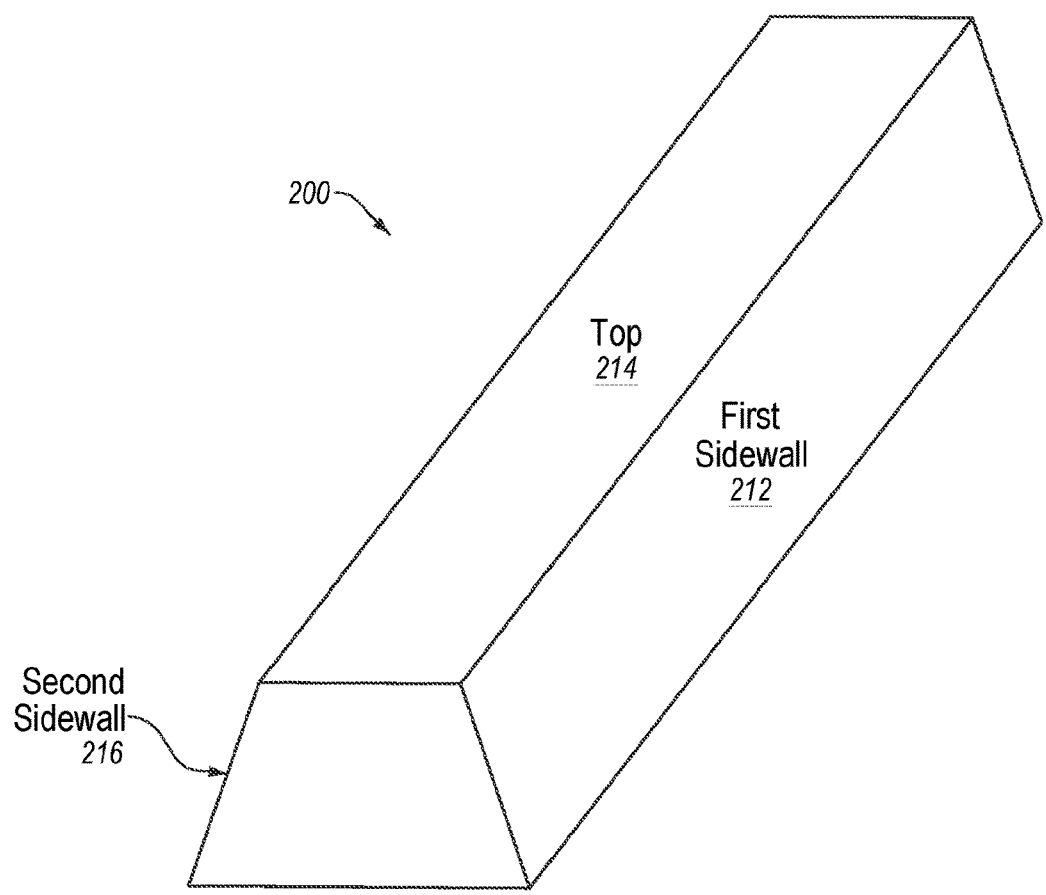
FIG. 2A
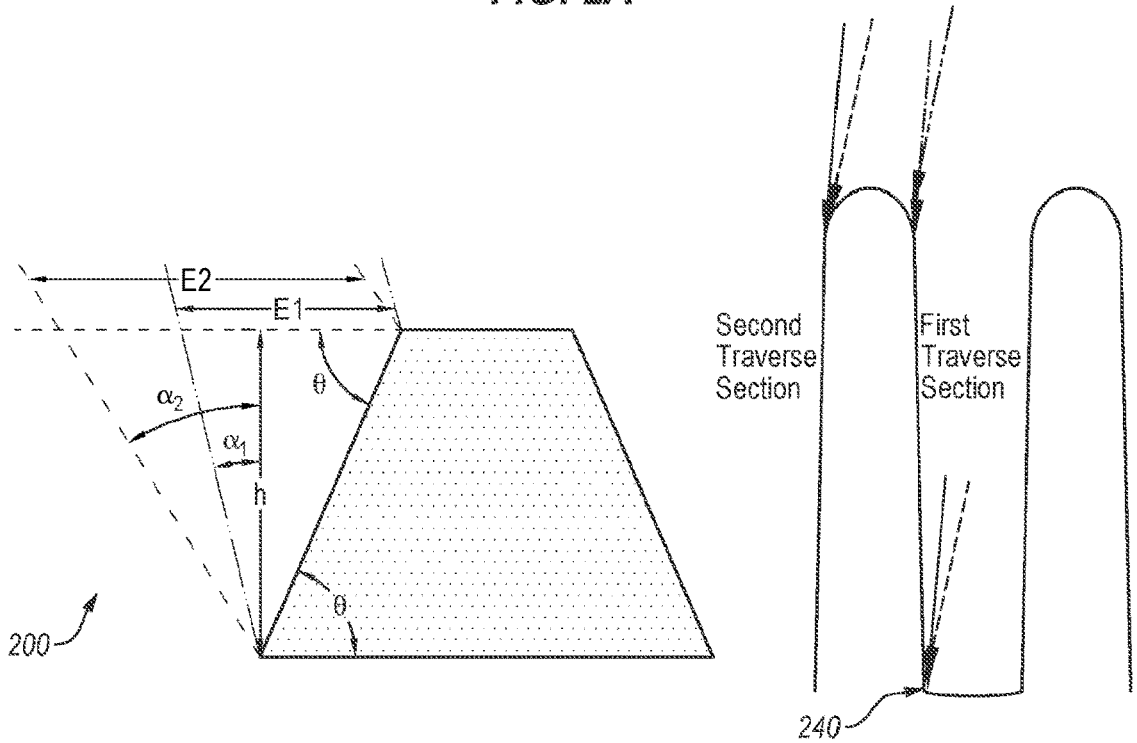
FIG. 2B
FIG. 2C

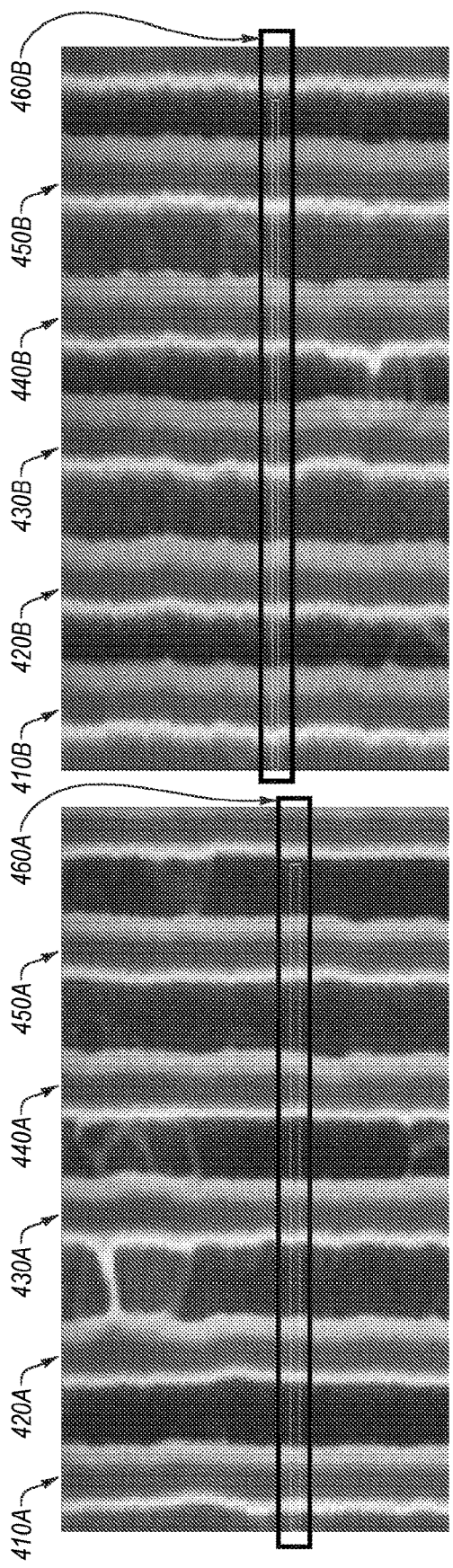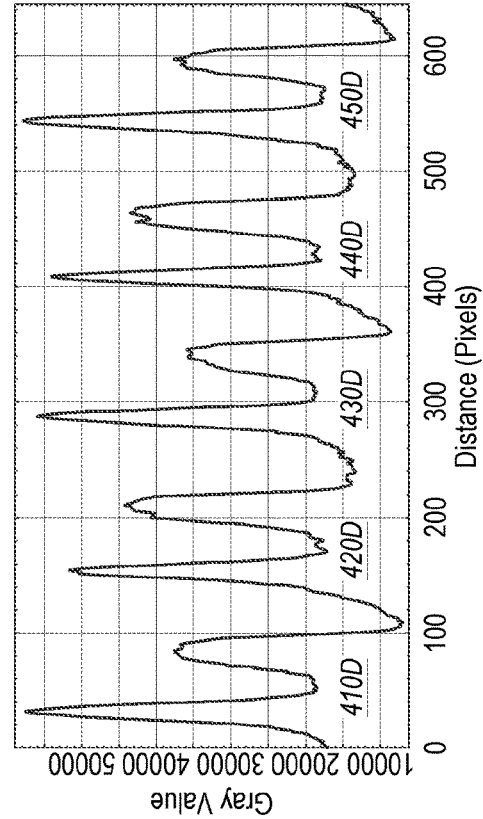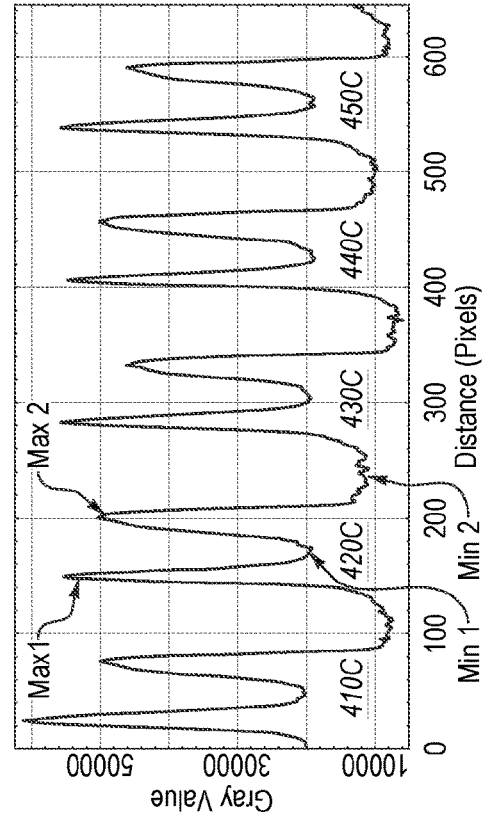
FIG. 4A
FIG. 4B
FIG. 4C
FIG. 4D

ENHANCED CROSS SECTIONAL FEATURES MEASUREMENT METHODOLOGY

TECHNICAL FIELD

The present disclosure generally relates to analyzing features of a structural element on a semiconductor wafer, and more specifically, relates to calculating and/or analyzing cross-sectional features of a structural element on a semiconductor waferusing inline measurements from two different tilt angles.

BACKGROUND

Integrated circuits are very complex devices that are manufactured by complex multi-staged manufacturing processes. Such manufacturing processes could include thousands of processing steps in the nanometer scale. Metrology is used, among other things, to monitor the fabrication process of these complex devices by controlling aspects such as design-to-process sensitivity and process variations and ensuring that the final device complies with certain preset parameters and/or patterns. Deviations from the preset parameters and/or patterns may lead to manufacturing failures which could adversely affect the electrical characteristics of the integrated circuit.

In order to reduce manufacturing failures, measure and reduce process variations, and reduce drifts from preset dimensions, certain metrology tools and imaging systems, such as a Critical Dimension Scanning Electron Microscope (CD-SEM) may be used to scan structural elements formed on semiconductor wafers. Existing metrology tools provide a top down view of the wafer and the structural elements thereon. Such a view may be sufficiently accurate for two dimensional patterns on the wafer but not for three dimensional patterns.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

Embodiments of the disclosure may correspond to a method for analyzing a feature of a structural element on a semiconductor wafer. The method may measure, inline, a structural element using a metrology tool. Taking a measurement may comprise: scanning, at a first tilt angle, a first location on a structural element and generating a first inspection image and scanning, at a second tilt angle, a second location on the structural element and generating a second inspection image. The metrology tool may also form a comparative representation by comparing the first inspection image and the second inspection image and may calculate the feature of the structural element from the comparative representation.

Other embodiments of the disclosure may correspond to a method for analyzing a plurality of features of a plurality of structural elements on a semiconductor wafer. The method may measure, inline, a plurality of structural elements using a metrology tool. Taking the measurements may comprise: scanning, at a first tilt angle, the plurality of structural elements and generate a first inspection image, being a first representation of the plurality of structural elements, and scanning, at a second tilt angle, the plurality of structural elements and generating a second inspection image, being a second representation of the plurality of structural elements. The method may further comprise using a metrology tool to form a comparative representation by comparing the first inspection image and the second inspection image, and to calculate the plurality of features of the plurality of structural elements from the comparative representation.

Yet other embodiments of the disclosure may correspond to a system that includes a metrology tool for measuring a structural element inline by, for example, scanning a structural element at a first tilt angle and at a second tilt angle. The metrology tool may also be used for generating a first inspection image and a second inspection image and forming a comparative representation by comparing the first inspection image and the second inspection image. The metrology tool may also calculate the feature of the structural element based on the comparative representation.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A illustrates a perspective view of an exemplary structural element;

FIG. 2B illustrates a cross section of the structural element of FIG. 2A;

FIG. 2C illustrates a cross section of an exemplary curved structural element;

FIGS. 4A and 4B illustrate inspection images produced in response to a CD-SEM scanned semiconductor wafer at 5 degrees and at 12 degrees, respectively, according to exemplary embodiments of the present disclosure;

FIGS. 4C and 4D illustrate waveforms generated from the inspection images in FIGS. 4A and 4B;

DETAILED DESCRIPTION OF EMBODIMENTS

Figure 1A:
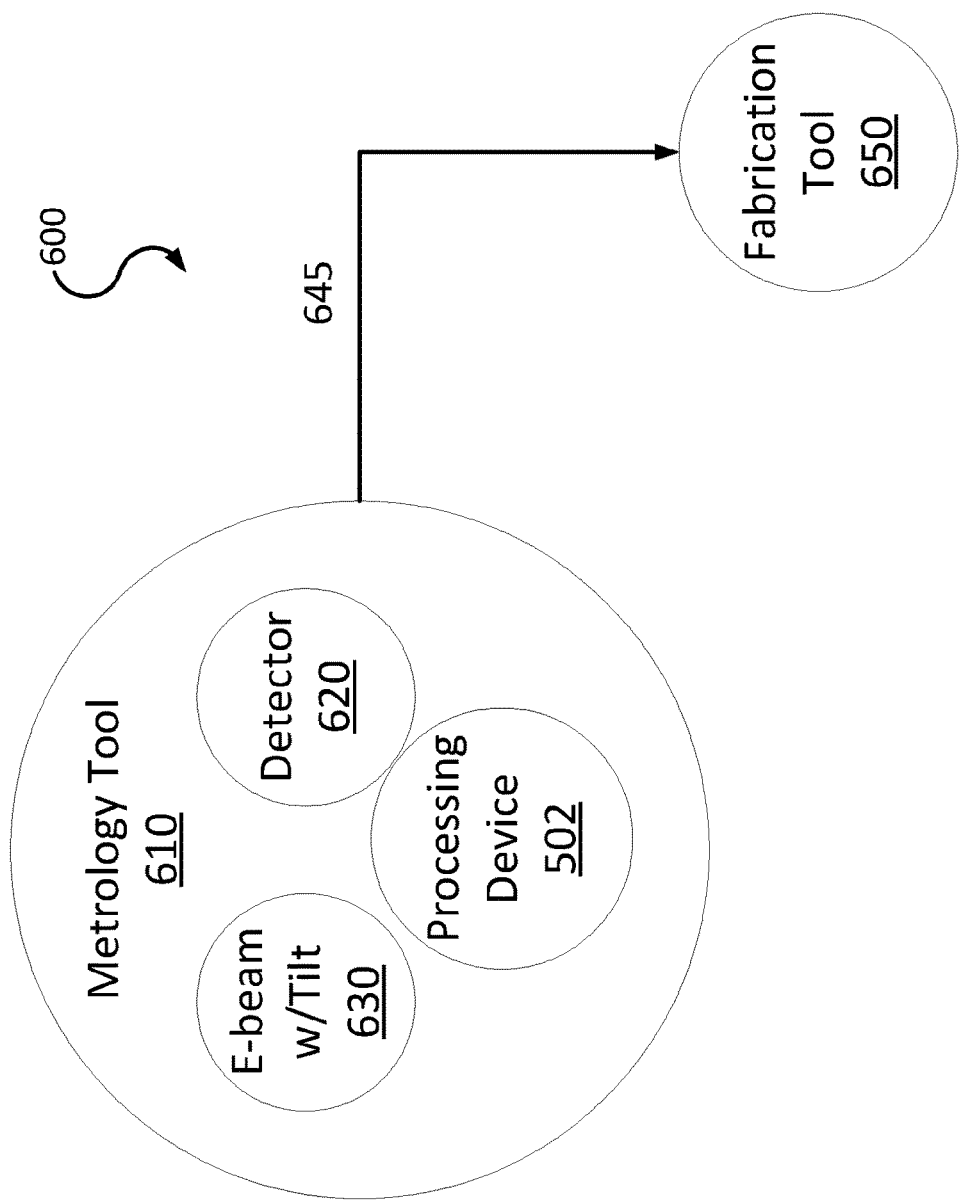
FIG. 1A illustrates an example environment of a metrology system for analyzing features of a cross-structural element according to embodiments of the present disclosure.

Embodiments of the disclosure are directed to methods for analyzing a feature or a plurality of features of a structural element or a plurality of structural elements on a semiconductor wafer. The feature may be a cross-sectional feature such as height or sidewall angle. The structural element may be two dimensional or three dimensional and may have sharp or curved edges. The analysis is performed in order to measure whether or not the structural element(s) matches preset dimensions. This analysis may be performed when developing a fabrication process and/or when monitoring the performance of an existing fabrication process. Such analysis controls design-to-process sensitivities and process variations and may also be referred to as metrology.

One of the goals of metrology is to determine whether the inspected structural elements include deviations from critical dimensions. This inspection is usually done by charged particles beam imaging that provides the high resolution required to measure said deviations.

A typical measured structural element is a line that has two opposing sidewalls. The measurement of the bottom width of the line involves measuring the top width of the line as well as measuring its sidewalls. Measurement of a structural element line critical dimensions using only a top view (in which the electron beam that scans the line is perpendicular to the substrate) may result in faulty results, especially when one of the sidewalls has a negative sidewall angle such that an upper end of the sidewall obscures a lower end of that sidewall.

In order to address said inaccuracies CD-SEM tools that enable electronic tilt of an electron beam were introduced. NanoSem 3D of Applied Materials from Santa Clara, is a fully automated CD-SEM that has a column that allows electronic tilting as well as mechanical tilting of the scanning electron beam to scan the wafer surface with various tilt angles from several directions.

With advancement in technology and the desire to include more computational power in the same area, structural elements on the wafer began developing vertically (forming three dimensional patterns). Reducing variations between preset dimensions and fabricated structural elements depends, among other factors, on accurate and reliable approximation of the structural elements' features. The top down view, provided by existing metrology tools and imaging systems, (such as a CD-SEM) may provide sufficiently accurate measurements for two dimensional structural elements on a semiconductor wafer but not for three dimensional structural elements. If the measurements of structural elements on semiconductors are flawed, design-to-process sensitivity may be reduced and process variations may persist, which could result in defective semiconductor wafers and compromised electrical characteristics of the fabricated integrated circuits.

Aspects of the present disclosure address the above and other deficiencies by providing methods and systems for analyzing structural elements on semiconductor wafers. If a measured structural element is significantly varied from a preset parameter, processing parameters may get adjusted to fine-tune the process so as to generate structural elements that match preset dimensions.

The analysis may be performed by a system that includes, among other components, a metrology tool (which may include a critical dimension scanning electron microscope (CD-SEM)). The metrology tool may scan the semiconductor wafer and structural elements thereon by taking inline measurements using e-beam with tilt (via electronic tilt or physical tilt) at a first tilt angle and at a second tilt angle (different from the first tilt angle). The scan may be performed at proximate locations to attain a reliable approximation of the structural element's feature.

The metrology tool may generate a first inspection image and a second inspection image corresponding to the scans obtained from the first tilt angle and the second tilt angle, respectively. Thereafter, the metrology tool may generate a first waveform plot and a second waveform plot from each inspection image. The first and second inspection images may be compared to form a comparative representation. In some embodiments, the first and second waveform plots (being graphical representations of the first and the second inspection images, respectively) may be aligned and overlapped (e.g., by the metrology tool), forming an aligned plot (being the comparative representation). Data may be extracted from the comparative representation (e.g., aligned plot) and used to calculate and arrive at an approximate value for the feature that is being analyzed (e.g., by the metrology tool). Arriving at an approximate value for the feature that is being analyzed may then cause the calculated value to be compared to the preselected value of that feature to determine whether a random, a systemic or an isolated failure to reach the preselected values occurred.

Advantages of the present disclosure include, but are not limited to, an improved system and method for accurately and reliably approximating the value of cross-sectional features of three dimensional curved structural elements on semiconductor wafers without formation of reference structures.

FIG. 1A illustrates an example environment of a metrology system 600 according to embodiments disclosed herein. In general, metrology system 600 may include a metrology tool 610 (having a detector 620 and an e-beam with tilt 630), and a fabrication tool 650. Metrology tool 610 may also include a processing device 502, which may be part of a computer system discussed in more detail in FIG. 5.

As shown in FIG. 1A, metrology system 600 includes a metrology tool 610 that may be used to provide information from an inline measurement and examination of an object (e.g., a structural element on semiconductor wafer) of three dimensional features on the object. The examination can be part of the semiconductor fabrication process and may be carried out during the fabrication of the object. In one embodiment, metrology tool 610 may include a critical dimension scanning electron microscope (CD-SEM) of the nature that will be described with respect to FIG. 1B.

Figure 1B:
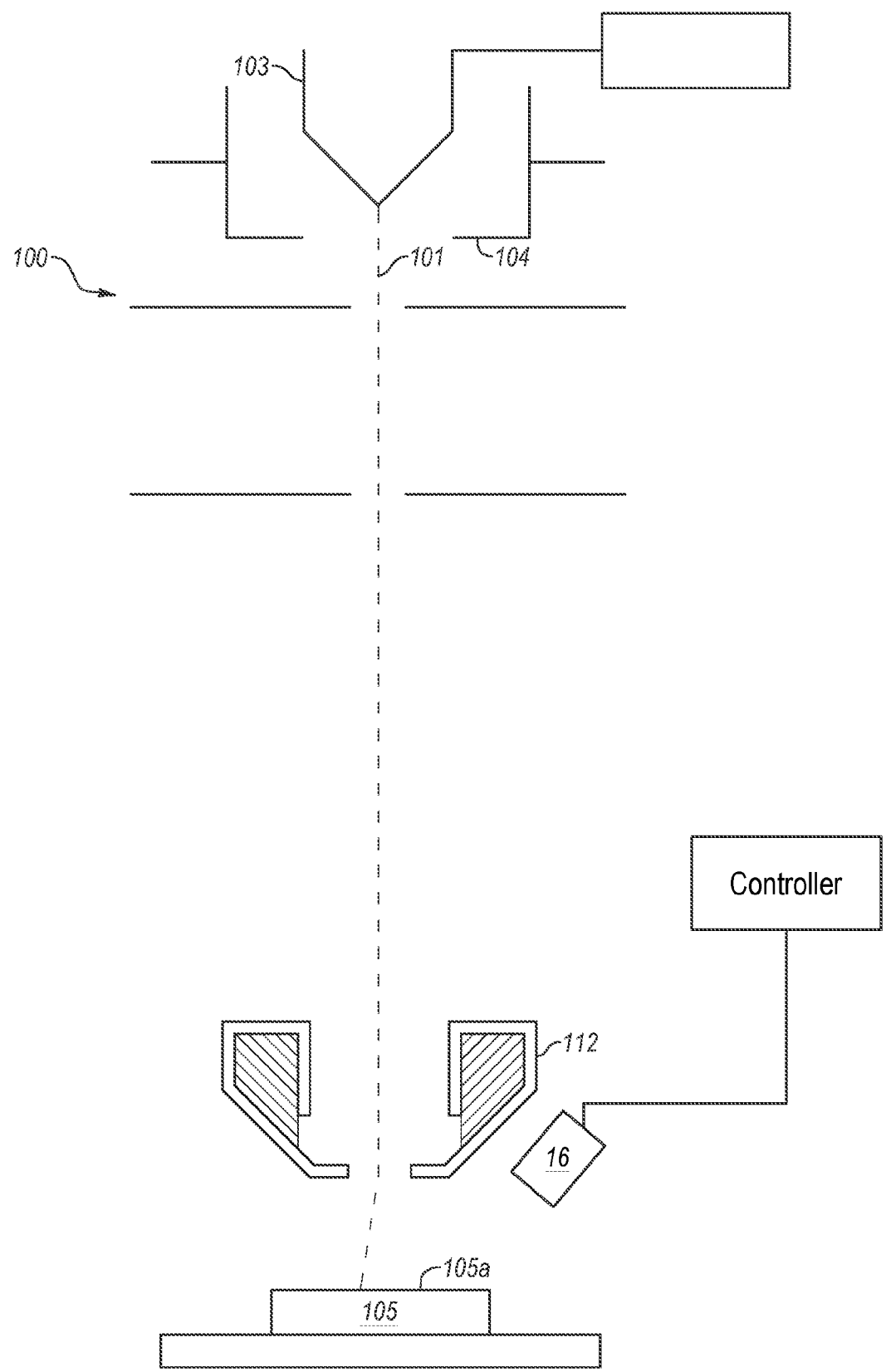
FIG. 1B illustrates an example critical dimension scanning electron microscope (CD-SEM) in accordance with an embodiment of the present disclosure.

FIG. 1B depicts an exemplary CD-SEM 100 that may be used as part of the metrology tool in embodiments disclosed herein. CD-SEM 100 may include an electron gun 103 for generating an electron beam 101, which may be extracted from anode 104. CD-SEM 100 may also include an objective lens 112 for focusing electron beam 101 on the surface 105a of object 105. The tilt angle of electronic beam 101 may be aligned so as to allow for inline measurements in tilt mode. Tilt mode may be utilized to inspect a sample's surface (e.g., a semiconductor wafer's surface) by taking measurements of structural elements on the surface with a particle beam that impinges onto the sample along an axis forming a certain angle with the sample's surface (also referred to as "an oblique angle of incidence"). The tilt mode may be attained via a variety of tilting mechanisms, such as, without limitations, electrical tilt (also referred to as "e-tilt") or physical tilt. Electrical tilt may be achieved by deflecting the electronic beam so that either by the deflection alone or in combination with the focusing of the electronic beam an oblique angle of incidence results. Physical tilt may be achieved by mechanically tilting the object.

CD-SEM 100 may further include a detector 16 (also corresponding to detector 620 in FIG. 1A) for detecting secondary electrons produced by the scanned object 105.

Detection signals may be processed by a computer system 500 (described in FIG. 5) of the metrology tool 610 and in particular by processing device 502 that may have image processing capabilities and may generate inspection images. The processing device 502 may also be configured to generate waveforms from said inspection images. The processing device 502 may also be configured to implement arithmetic calculations that may be used to analyze the inspection images and waveforms generated therefrom.

Returning back to FIG. 1A, metrology tool 610 may be used for scanning a structural element or a plurality of structural elements on a semiconductor wafer. The scanning may occur by taking inline measurements using e-beam with tilt (either electronic tilt or physical tilt) at a first tilt angle and at a second tilt angle. When metrology tool 610 comprises a CD-SEM, the CD-SEM may emit an electron beam at a certain tilt angle using e-beam with tilt tool 630 (similar to electron beam 101 in FIG. 1B) to a semiconductor wafer (similar to object 105 in FIG. 1B). In response, an output, optionally in a form of secondary electrons, may be generated by the semiconductor wafer. The secondary electrons may be detected by detector 620 (similar to detector 16 in FIG. 1B). In response, a processing device (such as processing device 502 in FIG. 5) may process output from the detector and may optionally generate an output depicting the semiconductor wafer. In some embodiments, the optional output from the detector may be an inspection image as shown in FIGS. 4A and 4B. The resulting inspection image may be processed to generate a waveform as shown in FIGS. 4C and 4D. A processing device 502 may, pursuant to certain instructions, compare the inspection images and optionally generate a comparative representation. For example, processing device 502 may form an aligned plot by overlapping two waveforms generated from two scans obtained by taking inline measurements using the e-beam with tilt at two different tilt angles. The processing device 502 may then calculate a feature (or plurality of features) of a structural element (or plurality of structural elements) based on the comparative representation (e.g., aligned plot). The processing device 502 may also implement arithmetic calculations that may be used to analyze the inspection images and/or waveforms generated therefrom. Said inspection images and corresponding waveforms may be informative of cross-sectional features of three dimensional structural elements on a semiconductor wafer and may assist in determining whether an isolated or systemic failure to reach the preselected values occurred during a fabrication process.

Metrology tool 610 may be configured, through a processing device for example (such as processing device 502 in FIG. 5), to compare the calculated feature to preselected parameters and to generate a determination output 645 indicating whether the calculated feature is within an acceptable deviation from the preselected parameters. An acceptable deviation from preselected parameters may be about ±30% or less, about ±25% or less, about ±20% or less, about ±15% or less, about ±10% or less, about ±9% or less, about ±8% or less, about ±7% or less, about ±6% or less, about ±5% or less, about ±4% or less, about ±3% or less, about ±2% or less, about ±1% or less, or about ±0.5% or less. A percent deviation may be calculated according to equation 1 below:

$$\% \text{ Deviation} = \frac{\text{Calculated Feature} - \text{Preselected Parameter}}{\text{Preselected Parameter}} \cdot 100\% \qquad \text{Equation 1}$$

Figure 5:
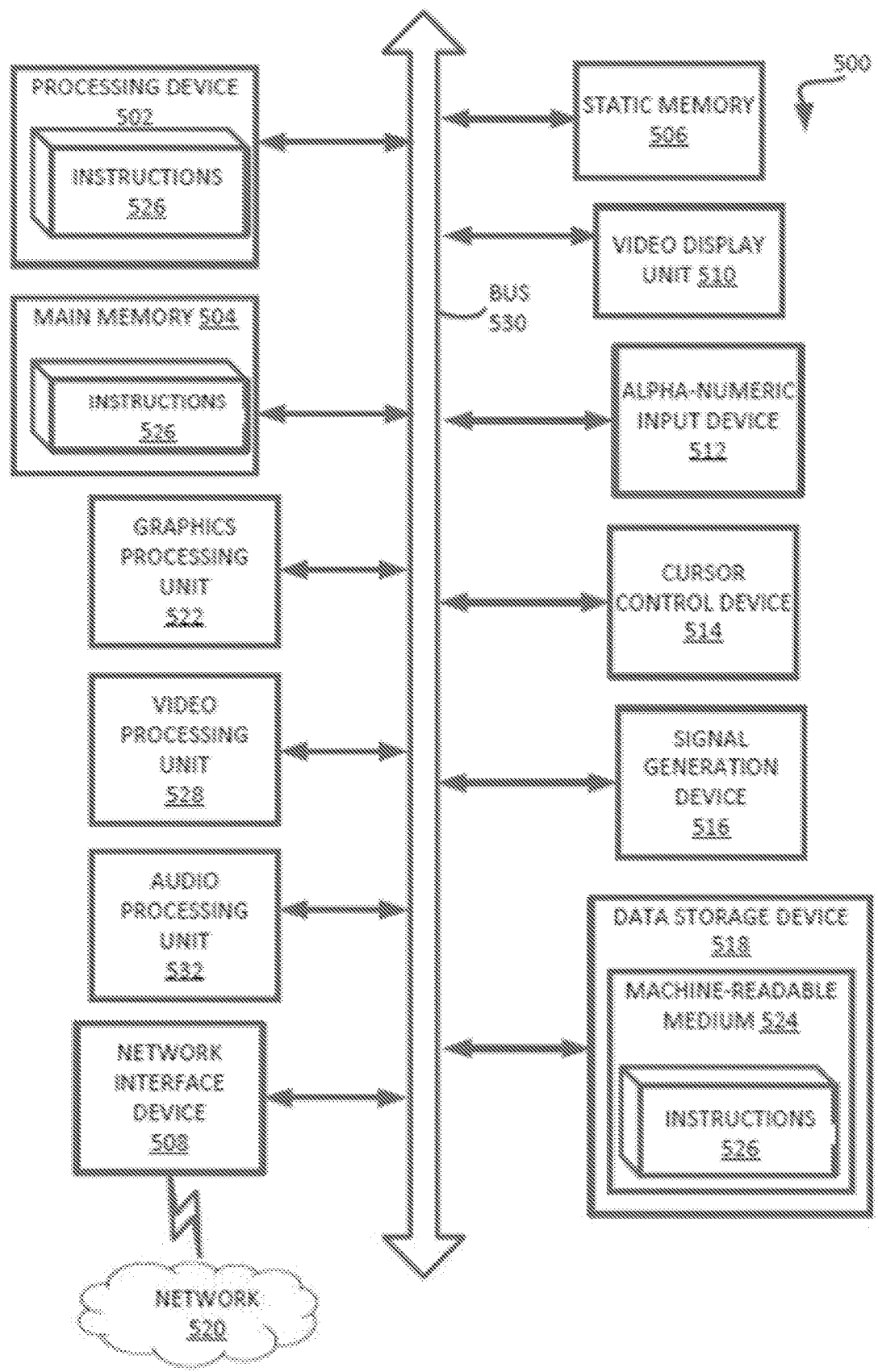
FIG. 5 is a block diagram of an example computer system in which embodiments of the present disclosure may operate.

In certain embodiments, comparing the calculated feature to preselected parameters to generate a determination output 645 may be done by a machine that may perform the review automatically (e.g., using a computer system such as computer system 500 in FIG. 5 and in particular a processing device such as processing device 502 in FIG. 5) in response to an algorithm. In other embodiments, comparing the calculated feature to preselected parameters may use input from a human that may manually compare the calculated features to preselected parameters.

Determination output 645 may be used to generate a set of instructions, such as a design of experiment and/or process parameters to be adjusted, that may be ultimately provided to fabrication tool 650. The set of instructions may cause fabrication tool 650 to fabricate semiconductor wafer(s) with varied process parameters. Fabrication tool 650 may be configured to maintain the existing fabrication process, adjust the fabrication process, or stop the fabrication process based on output 645, the set of instructions, and other optional intervening process units. For instance, if output 645 indicates that the calculated feature is within an acceptable deviation from the preselected parameters, the set of instructions would indicate to fabrication tool 650 that the fabrication process that is in place may be maintained. If determination output 645 indicates that the calculated feature is outside of an acceptable deviation from the preselected parameters, a set of instructions may be provided to generate and implement a design of experiments and/or to adjust certain process nodes to vary the fabrication process so as to optimize design-to-process sensitivity and/or to reduce process variations and/or to reduce deviations from preselected parameters.

In some embodiments, metrology tool 610 and fabrication tool 650 may be different tools located at the same or at different locations and may include the same or different computer systems such computer system 500, or a single tool operated in different modes and including a single computer system 500.

In some embodiments, metrology system 600 may be implemented in a distributed environment where metrology tool 610 (its various components such as processing device 502) and fabrication tool 650 are coupled to each other via networks.

FIG. 2A illustrates a perspective view of an exemplary structural element 200 that may be constructed on a semiconductor wafer. The structural element has a first sidewall 212 (also referred to herein as "right traverse section"), a second sidewall 216 (also referred to herein as "left traverse section"), and top 214. While the exemplary structural element depicted in FIG. 2A has sharp edges, structural elements discussed herein include those with sharp edges as well as those with curved edges.

FIG. 2B illustrates a cross-sectional depiction of the exemplary structural element 200 of FIG. 2A. A metrology tool, such as a CD-SEM, may provide a top down view of structural element 200. An electron beam may be directed at structural element 200 in a first tilt angle $\alpha_1$. In response, structural element 200 may emit secondary electrons at the first tilt angle $\alpha_1$ which may be used to arrive at a first critical dimension, $E_1$. The electron beam may subsequently be directed at structural element 200 in a second tilt angle $\alpha_2$.

In response, structural element 200 may emit secondary electrons at the second tilt angle $\alpha_2$ which may be used to arrive at a second critical dimension, $E_2$. Based on the first tilt angle, first critical dimension, second tilt angle, and second critical dimension, it may then be possible to calculate the height, h, and sidewall angle, e, of structural element 200 based on equations 2 and 3 below, $$\tan \alpha_2 - \tan \alpha_1 = \frac{E_2 - E_1}{h} \quad \text{Equation 2}$$

$$\tan \theta = \frac{h}{E_1 - h \cdot \tan \alpha_1} \quad \text{Equation 3}$$

which can be further mathematically manipulated to arrive at equations 4 and 5 below:

$$h = \frac{E_2 - E_1}{\tan \alpha_2 - \tan \alpha_1} \quad \text{Equation 4}$$

$$\theta = \tan^{-1}\left(\frac{E_2 - E_1}{E_1 \tan \alpha_2 - E_2 \tan \alpha_1}\right) \quad \text{Equation 5}$$

Equations 2-5 provide close approximations when calculating features of structural elements with sharp corners as depicted in FIGS. 2A and 2B. However, in reality structural elements built on semiconductor wafers may be curved as shown in FIG. 2C. Methodologies according to embodiments disclosed herein may be used to calculate features of curved structural elements, both arithmetically and graphically.

Various features of the structural element may be of interest including, but not limited to, height, angular orientation, width, cross-sectional shape. Methods and systems disclosed herein are directed to the analysis of cross-sectional features of three dimensional curved structural elements that are less likely to be accurately calculated with existing methods.

Figure 3:
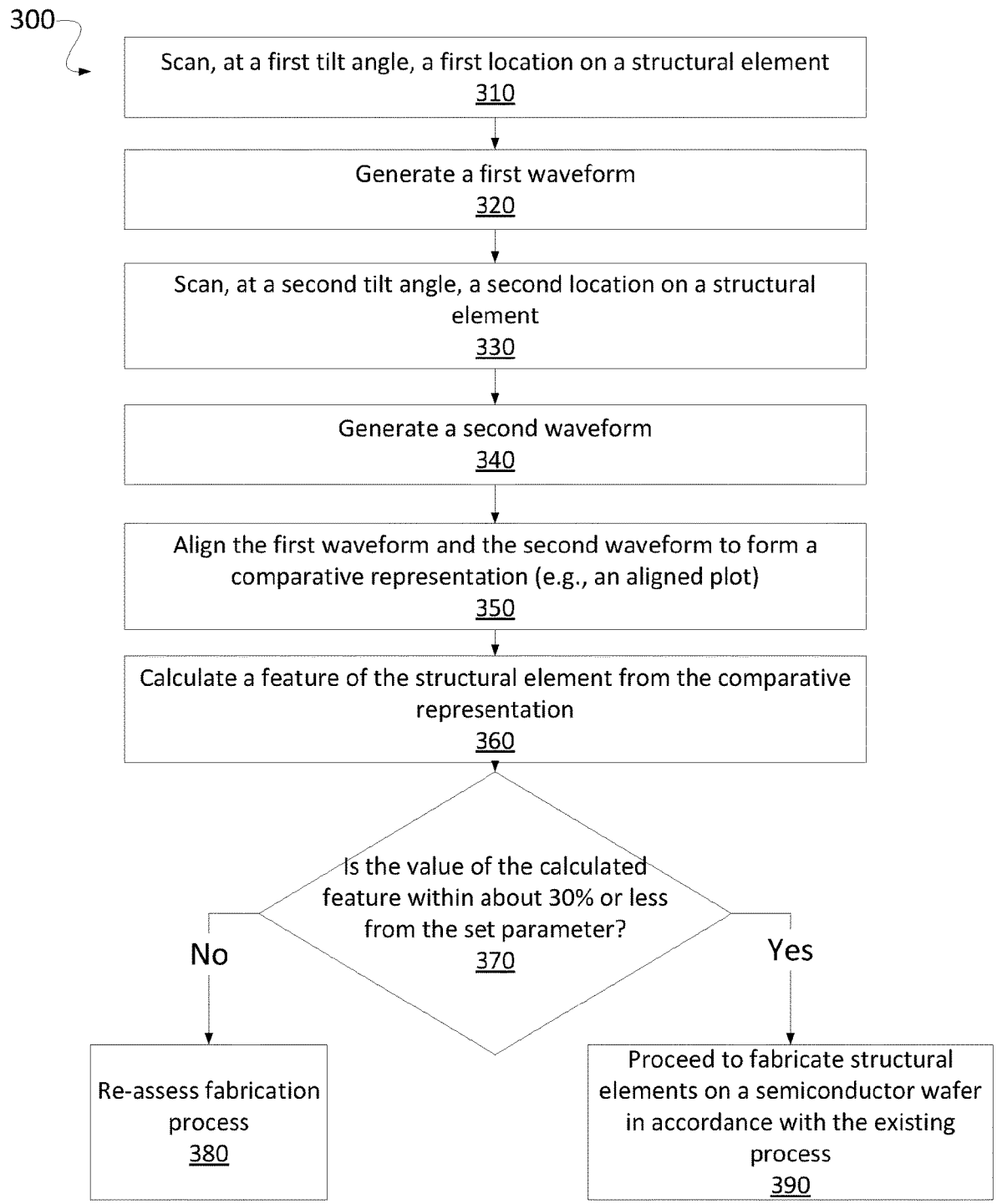
FIG. 3 is a flow diagram of an example method to analyze a feature of a structural element on a semiconductor wafer in accordance with certain embodiments of the present disclosure.

FIG. 3 depicts a flow diagram of a method 300 to analyze a feature of a structural element. The structural element may be on a semiconductor wafer and may be in the nanometer scale. Method 300 may be performed by processing logic that may include hardware (e.g., circuitry, dedicated logic, programmable logic, microcode, hardware of a device, integrated circuit, etc.), software (e.g., instructions run or executed on a processing device), or a combination thereof. In some embodiments, method 300 may be performed by metrology tool 610 of FIG. 1A.

As shown in FIG. 3, the method may begin, at block 310, with a metrology tool (such as metrology tool 610 in FIG. 1A) scanning by taking inline measurements using e-beam with tilt (electronic tilt or physical tilt), at a first tilt angle, of a first location on a structural element. The metrology tool may generate a first inspection image of the semiconductor wafer based on this inline measurement, e.g., FIG. 4A, pursuant to block 320. The first inspection image may be utilized to generate a first waveform, e.g., FIG. 4C. The processing logic may subsequently cause the metrology tool 610 to scan by taking inline measurements using e-beam with tilt (electronic tilt or physical tilt), at a second tilt angle, of a second location on the structural element pursuant to block 330. The metrology tool may then generate a second inspection image of the semiconductor wafer based on this inline measurement, e.g., FIG. 4B, pursuant to block 340.

The second inspection image may be utilized to generate a second waveform, e.g., FIG. 4D, of the semiconductor wafer.

The first tilt angle and the second tilt angle may range, independently, from above 0 to about 15 degrees. The first tilt angle and the second tilt angle may be different from each other. In some embodiments, the second tilt angle may be greater than the first tilt angle. In certain embodiments, the second tilt angle may be about 15 degrees and the first tilt angle may be about 10 degrees, about 8 degrees, about 5 degrees, or about 3 degrees. In other embodiments, the second tilt angle may be about 12 degrees and the first tilt angle may be about 8 degrees, about 5 degrees, or about 3 degrees. In yet other embodiments, the second tilt angle may be about 10 degrees and the first tilt angle may be about 5 degrees, or about 3 degrees. Other combinations not explicitly listed herein may also be possible. The larger the difference in tilt angles, the more accurate the final approximation of the cross sectional feature according to methods disclosed herein will be.

In some embodiments, the first tilt angle and/or the second tilt angle may be greater than 15 degrees (e.g., 20 degrees). For instance, greater tilt angles may be achieved through mechanical tilt by mechanically tilting the object that is being scanned.

The generated inspection images, as exemplified in FIGS. 4A and 4B, are depictions of the structural elements on the semiconductor wafer. Changes in the intensity of the grey color level (i.e., color contrasts in the inspection image) represent changes in the depth of the structural element as perceived by the detector from the secondary electrons that it detected.

Figure 4E:
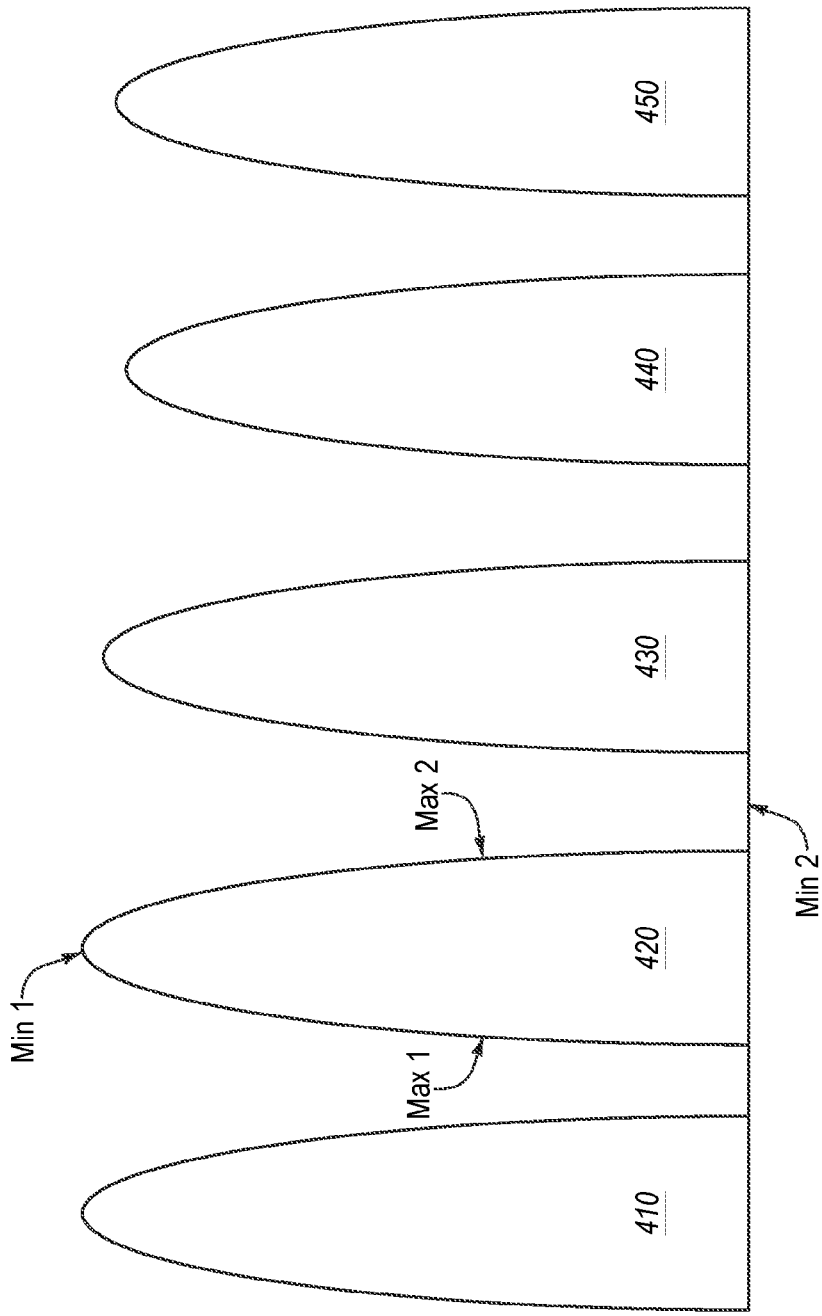
FIG. 4E is a pictorial representation of structural elements on a semiconductor wafer.

In certain embodiments, the inspection images may be translated into waveform plots of grey color level as a function of pixel, e.g., FIGS. 4C and 4D. For example, FIG. 4A depicts an inspection image produced after scanning a semiconductor wafer (e.g., scanning the structural elements 410, 420, 430, 440, and 450 from FIG. 4E) at a tilt angle of 5 degrees. Inspection image of FIG. 4A detected five structural elements 410A, 420A, 430A, 440A, and 450A, which correspond to structural elements 410C, 420C, 430C, 440C, and 450C, respectively in the waveform plot of FIG. 4C.

FIG. 4B depicts an inspection image produced after scanning a semiconductor wafer (e.g., scanning the structural elements 410, 420, 430, 440, and 450 from FIG. 4E) at a tilt angle of 12 degrees. Inspection image of FIG. 4B detected five structural elements 410B, 420B, 430B, 440B, and 450B, which correspond to structural elements 410D, 420D, 430D, 440D, and 450D, respectively in the waveform plot of FIG. 4D.

In certain embodiments, the waveforms (e.g., those of FIGS. 4C and 4D) may be generated from inspection images (e.g., those of FIGS. 4A and 4B) by selecting a section in the inspection image (e.g., sections 460A in FIG. 4A and 460B in FIG. 4B) to be processed and translated into grey scale level as a function of pixel plot.

Although certain parts of this disclosure may be presented graphically, it should be understood that identification of minimums, maximums, and points of minimal shifts between two waveform plots may all be derived through arithmetic calculations (e.g., by taking a first derivative and a second derivative). Arithmetic calculations may be performed in the background (i.e., without generating an inspection image, a waveform, or an aligned waveform plot). The instant disclosure is intended to encompass such calculations as well.

In these waveform plots, each structural element includes two maximums and two minimums. The first maximum (an example is denoted as Max 1) may correspond to the left traverse side of a curved structural element (shown in FIG. 4E on structural element 420 as Max 1). The first minimum (an example is denoted as Min 1) may correspond to the top of a curved structural element (shown in FIG. 4E on structural element 420 as Min 1). The second maximum (an example is denoted as Max 2) may correspond to the right traverse side of the curved structural element (shown in FIG. 4E on structural element 420 as Max 2). The second minimum (an example is denoted as Min 2) may correspond to the space between structural elements (shown in FIG. 4E on structural element 420 as Min 2).

Figure 4F:
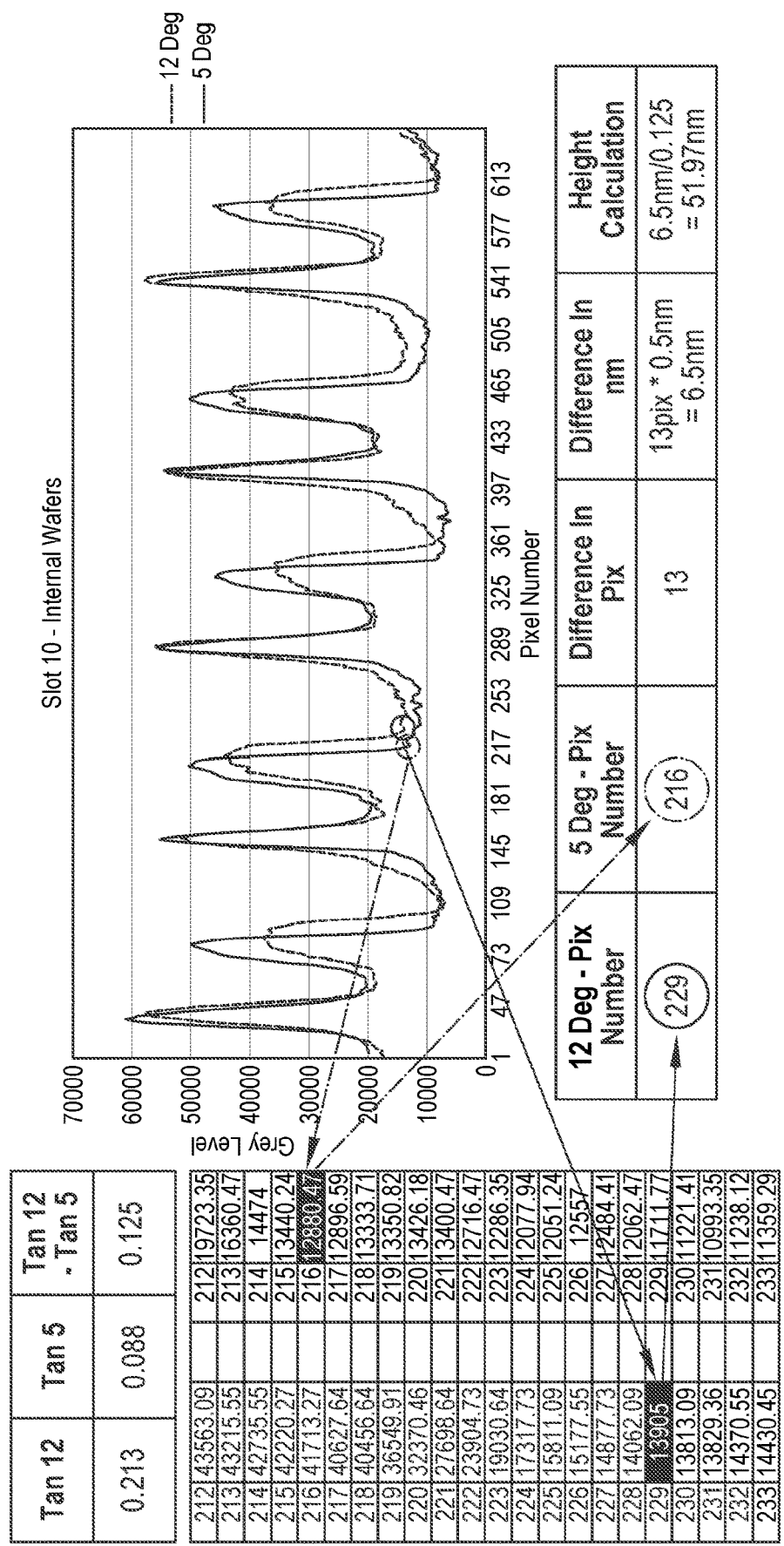
FIGS. 4F and 4G illustrate exemplary height calculations from the aligned plot generated by aligning and overlapping the waveform plots from FIGS. 4C and 4D, according to embodiments of the present disclosure.
Figure 4G:
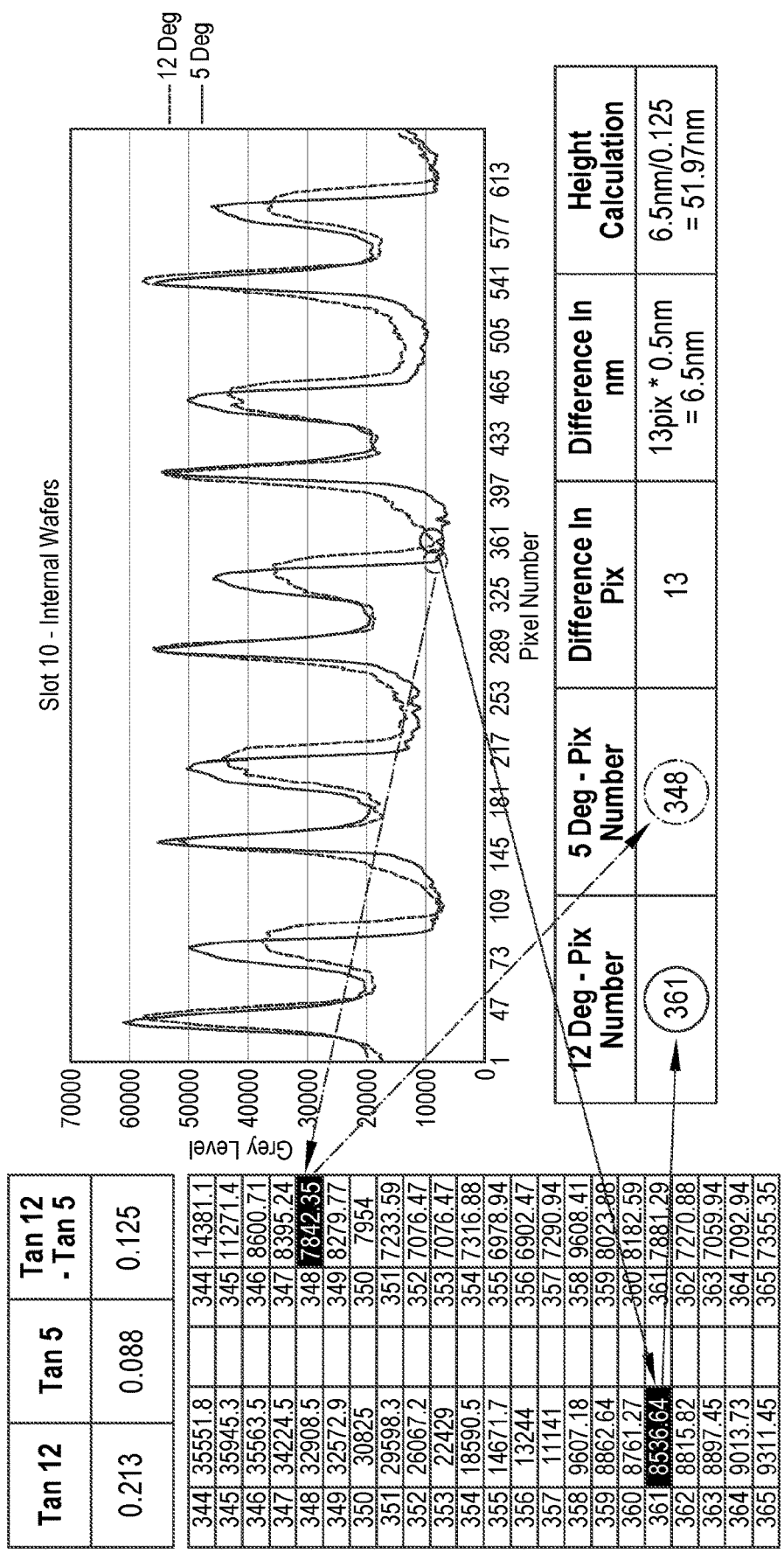

Returning to method 300 in FIG. 3, the processing logic may subsequently cause the metrology tool (e.g., 610) to form a comparative representation by comparing the first inspection image and the second inspection image pursuant to block 350. In certain embodiments, comparing the inspection images may comprise aligning the first waveform and the second waveform (generated from the first and second inspection images, respectively) to form an aligned plot (being the comparative representation) as shown in FIGS. 4F and 4G. The first waveform and the second waveform may be aligned by identifying a point of minimal shift (i.e., anchor point) between the first waveform and the second waveform. In some embodiments, the point of minimal shift (i.e., anchor point) between the waveforms may be the left traverse section of one of the structural elements (e.g., Max 1 of structural element 420C in FIG. 4C may be aligned with Max 1 of structural element 420D in FIG. 4D). In certain embodiments, aligning the first waveform and the second waveform based on one of the structural elements may be used for calculating a cross-sectional feature of that structural element only. In such embodiments, the first waveform and the second waveforms are re-aligned for each structural element (forming a plurality of aligned plots based on a plurality of different anchor points) to separately and independently calculate a plurality of features for the plurality of structural elements on the semiconductor wafer. This method may be referred to as anchoring each feature separately. For example, looking at FIGS. 4C and 4D, a first aligned plot may be formed by aligning the first peak, Max 1, for structural element 410C and 410D; a second aligned plot may be formed by aligning the first peak, Max 1, for structural element 420C and 420D; a third aligned plot may be formed by aligning the first peak, Max 1, for structural element 430C and 430D; a fourth aligned plot may be formed by aligning the first peak, Max 1, for structural element 440C and 440D; and a fifth aligned plot may be formed by aligning the first peak, Max 1, for structural element 450C and 450D. A plurality of features may then be calculated for each structural element from the corresponding aligned plot (i.e., the cross sectional height of structural element 410 may be calculated from the first aligned plot; the cross sectional height of structural element 420 may be calculated from the second aligned plot; and so on).

In other embodiments, a single aligned plot may be used for calculating a plurality of features for the plurality of structural elements (i.e., aligning the waveforms for one structural element aligns the others). For example, looking at FIGS. 4C and 4D, a single aligned plot may be formed by aligning the first peak, Max 1, for structural element 410C and 410D. The first peak for structural elements 420, 430, 440, and 450 may align itself in that single aligned plot, and separate anchoring for each structural element may be skipped.

In certain embodiments, the metrology tool may scan a particular location on the semiconductor wafer (e.g., by taking inline measurements using e-beam with tilt) and generate an inspection image and a corresponding waveform of a single structural element to be analyzed. In other embodiments, a plurality of structural elements may be scanned (e.g., by taking measurements inline using e-beam with tilt) at a first tilt angle to generate a first inspection image comprising a first representation of the plurality of structural elements. The plurality of structural elements may subsequently be scanned (e.g., by taking measurements inline using e-beam with tilt) at a second tilt angle to generate a second inspection image comprising a second representation of the plurality of structural elements. The first and second inspection images in this embodiment may be compared to form a comparative representation as previously discussed.

Back to FIG. 3, the processing logic may further calculate the feature of the structural element from the comparative representation pursuant to block 360. Calculating the feature may include subtracting a first critical dimension identified in the first inspection image (and optionally from a first waveform generated therefrom) from a second critical dimension identified in the second inspection image (and optionally from a second waveform generated therefrom) to arrive at a difference in critical dimensions. Looking at FIGS. 4C and 4D, the first critical dimension ($E_{1curved}$) may be the pixel that corresponds to the second minimum, Min 2, of structural element 420C for example. The second critical dimension ($E_{2curved}$) may be the pixel that corresponds to the second minimum, Min 2, of structural element 420D for example.

If the relationship between pixels and a unit of length (e.g., nanometers) is known (e.g., one pixel equals 0.5 nm), the difference in pixels ($E_{2curved}-E_{1curved}$) may be translated to a difference in length units. The processing logic may determine a feature of the structural element (such as height, sidewall angle, sidewall profile, etc) based on the difference in critical dimensions (as converted to length units), the first tilt angle, and the second tilt angle pursuant to equations 4 and 5 above.

When a plurality of features from a plurality of structural elements is being analyzed, the calculation described above may be repeated for each structural element.

The metrology tool may cause the calculated feature to be compared to preselected parameters to determine whether an isolated or a systemic failure to reach preselected parameters has occurred pursuant to block 370. If the value of the calculated feature is within about 30% or less (or another acceptable deviation) from the preselected parameters, then the existing fabrication process may continue to fabricate structural elements on the semiconductor wafer in accordance with the existing procedure, pursuant to block 390. Otherwise, the fabrication process may be re-assessed pursuant to block 380. Re-assessing the fabrication process may involve automatically adjusting the process, stopping the process altogether, or generating and implementing a design of experiments to further assess the fabrication process and determine which nodes in the fabrication process can be adjusted. Instructions as to re-assessment of the fabrication process may be provided to fabrication tool 650 (in FIG. 1) and may be influenced, among other factors, by output 645 (in FIG. 1).

An acceptable deviation from preselected parameters may be about ±30% or less, about ±25% or less, about ±20% or less, about ±15% or less, about ±10% or less, about ±9% or less, about ±8% or less, about ±7% or less, about ±6% or less, about ±5% or less, about ±4% or less, about ±3% or less, about ±2% or less, about ±1% or less, or about ±0.5% or less. A percent deviation may be calculated according to equation 1 above.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

Processing device 502 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein (e.g., the operations and steps discussed above with respect to metrology tool 610).

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a computer-readable medium) on which is stored one or more sets of instructions or software 526 embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In one embodiment, the instructions 526 include instructions to implement functionality corresponding to analysis of a feature of a structural element on a semiconductor wafer (e.g., metrology tool 610 of FIG. 1A). While the machine-readable storage medium 524 is shown in an example embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("RUM"), random access memory ("RAM"), magnetic disk storage media, optical storage media, flash memory devices, etc.

EXAMPLES

The following examples are set forth to assist in understanding the invention and should not, of course, be construed as specifically limiting the invention described and claimed herein. Such variations of the invention, including the substitution of all equivalents now known or later developed, which would be within the purview of those skilled in the art, and changes in formulation or minor changes in experimental design, are to be considered to fall within the scope of the invention incorporated herein.

FIG. 4F illustrates an analysis of the cross-sectional height of a three dimensional structural element according to methods disclosed herein. A semiconductor wafer was scanned by taking inline measurement, using a CD-SEM using its e-beam with tilt capability, at a first tilt angle of 5 degrees and a first inspection image (FIG. 4A) was generated. A section from the first inspection image (denoted with box 460A) was translated into a first waveform (FIG. 4C). The first waveform was plotted as a grey color level as a function of pixel plot. The same semiconductor wafer was scanned by taking inline measurement, using the CD-SEM again using its e-beam with tilt capability, at a second tilt angle of 12 degrees and a second inspection image (FIG. 4B) was generated. A section from the second inspection image (denoted with box 460B) was translated into a second waveform (FIG. 4D). The second waveform was also plotted as a grey color level as a function of pixel plot.

The inspection images in the instant example (FIG. 4A and FIG. 4B) were obtained under an embodiment where the electron beam in the CD-SEM was tilted in a direction that provides view of the right edge and side wall (i.e., when the azimuth angle was 0 degrees), as depicted by the arrows in FIG. 2C. The electron beam may be pointed in other directions as well by changing the azimuth angle. In some embodiments, the electron beam may be pointed in a top-to-bottom direction, bottom-to-top direction, right-to-left direction, or left-to-right direction. Methodologies disclosed herein may apply to inspection images (and corresponding waveforms) attained from various electron beam scanning directions and are not limited to the direction illustrated in the examples.

The first waveform (FIG. 4C) and second waveform (FIG. 4D) were aligned and overlapped to generate the aligned plot depicted in FIG. 4F. The waveforms were aligned based on left edge alignment (also referred to as left traverse section alignment). For a selected structural element (e.g., 420C and 420D), the second minimum, Min 2, corresponding to the right bottom corner of the curved three-dimensional structural element (e.g., contact point 240 in FIG. 2C) was identified and its pixel number denoted. The pixel number corresponding to the Min 2 of 420C in the first waveform (for 5 degrees) was 216. The pixel number corresponding to the Min 2 of 420D in the second waveform (for 12 degrees) was 229. The difference in pixel numbers was calculated as 13. The relationship between the pixels and length unit was 0.5 nanometers for each pixel. Therefore, 13 pixels correspond to 6.5 nanometers. These calculated values were plugged into equation 4 to arrive at an approximation for the height of the curved three-dimensional structural element. The calculation is shown below:

$$h = \frac{E_2 - E_1}{\tan \alpha_2 - \tan \alpha_1} =$$

$$\frac{(229 \text{ pixel} - 216 \text{ pixel}) \cdot \frac{0.5 \text{ nm}}{1 \text{ pixel}}}{\tan(12) - \tan(5)} = \frac{6.5 \text{ nm}}{0.125} = 51.97 \text{ nm}$$

A similar calculation was performed on a different structural element in the same aligned plot as shown in FIG. 4G. The pixel number corresponding to Min 2 in 430C in the first waveform (for 5 degrees) was 348. The pixel number corresponding to the Min 2 in 430D in the second waveform (for 12 degrees) was 361. These values were plugged into equation 4 to arrive at an approximation for the height of the curved three-dimensional structural element. The calculation is shown below:

$$h = \frac{E_2 - E_1}{\tan \alpha_2 - \tan \alpha_1} =$$

$$\frac{(229 \text{ pixel} - 216 \text{ pixel}) \cdot \frac{0.5 \text{ nm}}{1 \text{ pixel}}}{\tan(12) - \tan(5)} = \frac{6.5 \text{ nm}}{0.125} = 51.97 \text{ nm}$$

In the foregoing specification, embodiments of the disclosure have been described with reference to specific example embodiments thereof. It will be evident that various modifications may be made thereto without departing from the broader spirit and scope of embodiments of the disclosure as set forth in the following claims. The specification and drawings are, accordingly, to be regarded in an illustrative sense rather than a restrictive sense.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method for analyzing a feature of a structural element on a semiconductor wafer, the method comprising:
   measuring, inline, the structural element using a metrology tool, wherein the measuring comprises:
      scanning, at a first tilt angle, the structural element and generating a first inspection image; and
      scanning, at a second tilt angle, the structural element and generating a second inspection image;
   comparing the first inspection image and the second inspection image to form a comparative representation; and
   calculating the feature of the structural element from the comparative representation.

2. The method of claim 1, further comprising:
   generating a first waveform from the first inspection image; and
   generating a second waveform from the second inspection image,
   wherein the comparative representation is an aligned plot, wherein comparing comprises aligning the first waveform and the second waveform to form the aligned plot, and wherein aligning comprises identifying a point of minimal shift between the first waveform and the second waveform.

3. The method of claim 2, wherein the point of minimal shift represents a left traverse section on the structural element.

4. The method of claim 1, wherein calculating comprises:
   subtracting a first critical dimension identified in the first inspection image from a second critical dimension identified in the second inspection image to arrive at a difference in critical dimensions; and
   determining the feature of the structural element based on the difference in critical dimensions, the first tilt angle, and the second tilt angle.

5. The method of claim 1, wherein the first tilt angle and the second tilt angle range, independently, from above 0 to about 15 degrees, and wherein the second tilt angle is greater than the first tilt angle.

6. The method of claim 1, wherein the feature is height, sidewall angle, or sidewall profile.

7. The method of claim 1, further comprising:
   comparing the calculated feature to selected parameters to determine whether an isolated or a systematic failure to reach selected parameters occurred.

8. A method for analyzing a plurality of features of a plurality of structural elements on a semiconductor wafer, the method comprising:
   measuring, inline, the plurality of structural elements using a metrology tool, wherein the measuring comprises:
      scanning, at a first tilt angle, the plurality of structural elements and generating a first inspection image, wherein the first inspection image comprises a first representation of the plurality of structural elements; and
      scanning, at a second tilt angle, the plurality of structural elements and generating a second inspection image, wherein the second inspection image comprises a second representation of the plurality of structural elements;
   comparing the first inspection image and the second inspection image to form a comparative representation; and
   calculating the plurality of features of the plurality of structural elements from the comparative representation.

9. The method of claim 8, further comprising:
   generating a first waveform from the first inspection image; and
   generating a second waveform from the second inspection image,
   wherein the comparative representation is an aligned plot, wherein comparing comprises aligning the first waveform and the second waveform to form the aligned plot, and wherein aligning comprises identifying a point of minimal shift between the first waveform and the second waveform in the aligned plot for a structural element from the plurality of structural elements.

10. The method of claim 9, wherein the point of minimal shift for the structural element represents a left traverse section on the structural element.

11. The method of claim 9, wherein aligning further comprises repeating the step of identifying the point of minimal shift between the first waveform and the second waveform in the aligned plot for each structural element from plurality of structural elements.

12. The method of claim 8, wherein calculating comprises performing a subtracting operation, the subtracting operation comprising subtracting a first critical dimension identified in the first inspection image from a second critical dimension identified in the second inspection image to arrive at a difference in critical dimensions for a structural element from the plurality of structural elements; and
   determining the feature of the structural element based on the difference in critical dimensions, the first tilt angle, and the second tilt angle.

13. The method of claim 12, wherein calculating further comprises:
   repeating the subtracting step for the plurality of structural elements to arrive at a plurality of differences in critical dimensions; and
   determining the plurality of features of the plurality of structural elements based on the plurality of differences in critical dimensions, the first tilt angle, and the second tilt angle.

14. The method of claim 8, wherein the first tilt angle and the second tilt angle range, independently, from above 0 to about 15 degrees, and wherein the second tilt angle is greater than the first tilt angle.

15. The method of claim 8, wherein the plurality of features are height, sidewall angle, or sidewall profile.

16. The method of claim 8, further comprising:
   comparing the calculated plurality of features to selected parameters to determine whether an isolated or a systemic failure to reach selected parameters occurred.

17. A system for calculating a feature of a structural element on a semiconductor wafer comprising:
   a metrology tool to:
      measure the structural element inline by scanning the structural element at a first tilt angle and at a second tilt angle;

generate a first inspection image and a second inspection image;

form a comparative representation of the first inspection image and the second inspection image; and calculate the feature of the structural element based on the comparative representation.

18. The system of claim 17, wherein the metrology tool comprises a critical dimension scanning electron microscope (CD-SEM).

19. The system of claim 17, wherein the first tilt angle and the second tilt angle range, independently, from above 0 to about 15 degrees, and wherein the second tilt angle is greater than the first tilt angle.

20. The system of claim 17, wherein to calculate the feature of the structural element, the metrology tool is configured to:

subtract a first critical dimension identified in the first inspection image from a second critical dimension identified in the second inspection image to arrive at a difference in critical dimensions; and determine the feature of the structural element based on the difference in critical dimensions, the first tilt angle, and the second tilt angle.

* * * * *